(12) United States Patent
Lin et al.

(10) Patent No.: US 10,930,745 B1
(45) Date of Patent: Feb. 23, 2021

(54) SEMICONDUCTOR STRUCTURE

(71) Applicant: Vanguard International Semiconductor Corporation, Hsinchu (TW)

(72) Inventors: Shin-Cheng Lin, Tainan (TW); Chih-Yen Chen, Tainan (TW); Chia-Ching Huang, Taoyuan (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/698,184

(22) Filed: Nov. 27, 2019

(51) Int. Cl.
*H01L 29/40* (2006.01)
*H01L 29/423* (2006.01)
*H01L 29/417* (2006.01)
*H01L 29/20* (2006.01)
*H01L 29/778* (2006.01)
*H01L 29/205* (2006.01)

(52) U.S. Cl.
CPC ........ *H01L 29/402* (2013.01); *H01L 29/2003* (2013.01); *H01L 29/205* (2013.01); *H01L 29/41758* (2013.01); *H01L 29/41775* (2013.01); *H01L 29/42316* (2013.01); *H01L 29/7787* (2013.01)

(58) Field of Classification Search
CPC ............... H01L 29/402; H01L 29/7787; H01L 29/41775; H01L 29/205; H01L 29/2003; H01L 29/42316; H01L 29/41758
See application file for complete search history.

(56) References Cited

U.S. PATENT DOCUMENTS

| | | | | |
|---|---|---|---|---|
| 9,306,014 | B1 * | 4/2016 | Kudymov | ........... H01L 29/2003 |
| 9,722,063 | B1 * | 8/2017 | Kudymov | ......... H01L 29/41758 |
| 2001/0012671 | A1 * | 8/2001 | Hoshino | ............... H01L 27/088 438/305 |
| 2006/0175658 | A1 * | 8/2006 | Lee | ................... H01L 29/41725 257/341 |
| 2012/0187451 | A1 * | 7/2012 | Saito | ................... H01L 29/0623 257/192 |
| 2012/0267636 | A1 * | 10/2012 | Zundel | .................. H01L 29/872 257/76 |
| 2013/0093012 | A1 * | 4/2013 | Zhang | ................. H01L 29/7835 257/335 |
| 2014/0312417 | A1 * | 10/2014 | Strasser | ............. H01L 29/7816 257/339 |

(Continued)

*Primary Examiner* — Victor A Mandala
(74) *Attorney, Agent, or Firm* — Birch, Stewart, Kolasch & Birch, LLP

(57) ABSTRACT

A semiconductor structure includes a substrate, a gate structure disposed on the substrate, a source structure and a drain structure disposed on opposite sides of the gate structure, and a first dielectric layer. The gate structure includes a gate electrode disposed on the substrate and a gate metal layer electrically connected to the gate electrode and serving as a gate field plate. The source structure includes a source electrode disposed on the substrate and a first source metal layer electrically connected to the source electrode and extending in the direction from the gate electrode to the drain structure. The first dielectric layer is disposed on the gate metal layer. The electric potential of the first source metal layer is different from that of the gate metal layer. The first source metal layer exposes at least a portion of the first dielectric layer directly above the gate metal layer.

20 Claims, 9 Drawing Sheets

(56) References Cited

U.S. PATENT DOCUMENTS

| | | | |
|---|---|---|---|
| 2015/0270355 A1* | 9/2015 | Kuraguchi | H01L 29/0619 |
| | | | 257/194 |
| 2015/0270379 A1* | 9/2015 | Kuraguchi | H01L 29/063 |
| | | | 257/194 |
| 2017/0345919 A1* | 11/2017 | Oyama | H01L 29/0657 |
| 2019/0288066 A1* | 9/2019 | Lee | H01L 29/0847 |
| 2019/0296112 A1* | 9/2019 | Yoshimochi | H01L 29/42356 |
| 2019/0363185 A1* | 11/2019 | You | H01L 29/7816 |
| 2020/0091331 A1* | 3/2020 | Hung | H01L 29/7787 |
| 2020/0373420 A1* | 11/2020 | Chou | H01L 29/2003 |

\* cited by examiner

SEMICONDUCTOR STRUCTURE

BACKGROUND

Technical Field

The disclosure relates to a semiconductor structure, and more particularly to a semiconductor structure having field plates.

Description of the Related Art

Gallium nitride-based (GaN-based) semiconductor materials have many excellent characteristics, such as high thermal resistance, a wide band-gap, and a high electron saturation rate. Therefore, GaN-based semiconductor materials are suitable for use in high-speed and high-temperature operating environments. In recent years, GaN-based semiconductor materials have been widely used in light-emitting diode (LED) elements and high-frequency elements, such as high electron mobility transistors (HEMT) with heterogeneous interfacial structures.

In high electron mobility transistors (HEMT), field plates are typically disposed in the high electric field region of the semiconductor device in order to reduce the peak electric field of the high electric field region. A type of field plate is a field plate that is in connection with a source electrode (i.e. source field plate). The source field plate can reduce gate-to-drain capacitance ($C_{gd}$). Another type of field plate is a field plate that is in connection with the gate electrode (i.e. gate field plate), which can reduce the electric field intensity at the side the gate nearest the drain. However, the configuration of the field plate structure causes the gate-to-source capacitance ($C_{gs}$) to rise sharply and causes severe switching loss.

With the developments of GaN-based semiconductor materials, those semiconductor devices which use GaN-based semiconductor materials are applied in the more critical working environments, such as those with higher frequencies or higher temperatures. Therefore, the conditions of the process of fabricating semiconductor devices with GaN-based semiconductor materials face various new challenges.

SUMMARY

In one embodiment of the present disclosure, a semiconductor structure is provided, wherein the semiconductor structure includes a substrate, a gate structure disposed on the substrate, a source structure and a drain structure disposed on opposite sides of the gate structure, and a first dielectric layer. The gate structure includes a gate electrode disposed on the substrate and a gate metal layer which is electrically connected to the gate electrode and serves as a gate field plate. The source structure includes a source electrode disposed on the substrate and a first source metal layer which is electrically connected to the source electrode and extends in the direction from the gate electrode to the drain structure. The first dielectric layer is disposed on the gate metal layer. The electric potential of the first source metal layer is different from that of the gate metal layer. The first source metal layer exposes at least a portion of the first dielectric layer directly above the gate metal layer.

In one embodiment of the present disclosure, a semiconductor structure is provided, wherein the semiconductor structure includes a substrate, a gate structure disposed on the substrate, a source structure disposed on the substrate, and a drain structure disposed on the substrate. The gate structure includes a gate electrode disposed on the substrate and a gate metal layer electrically connected to the gate electrode and serving as a gate field plate. The source structure includes a source electrode disposed on the substrate and a first source metal layer electrically connected to the source electrode and serving as a source field plate. The electric potential of the first source metal layer is different from the electric potential of the gate metal layer. From a top view, the first source metal layer has an opening directly above the gate metal layer.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION

Figure 1:
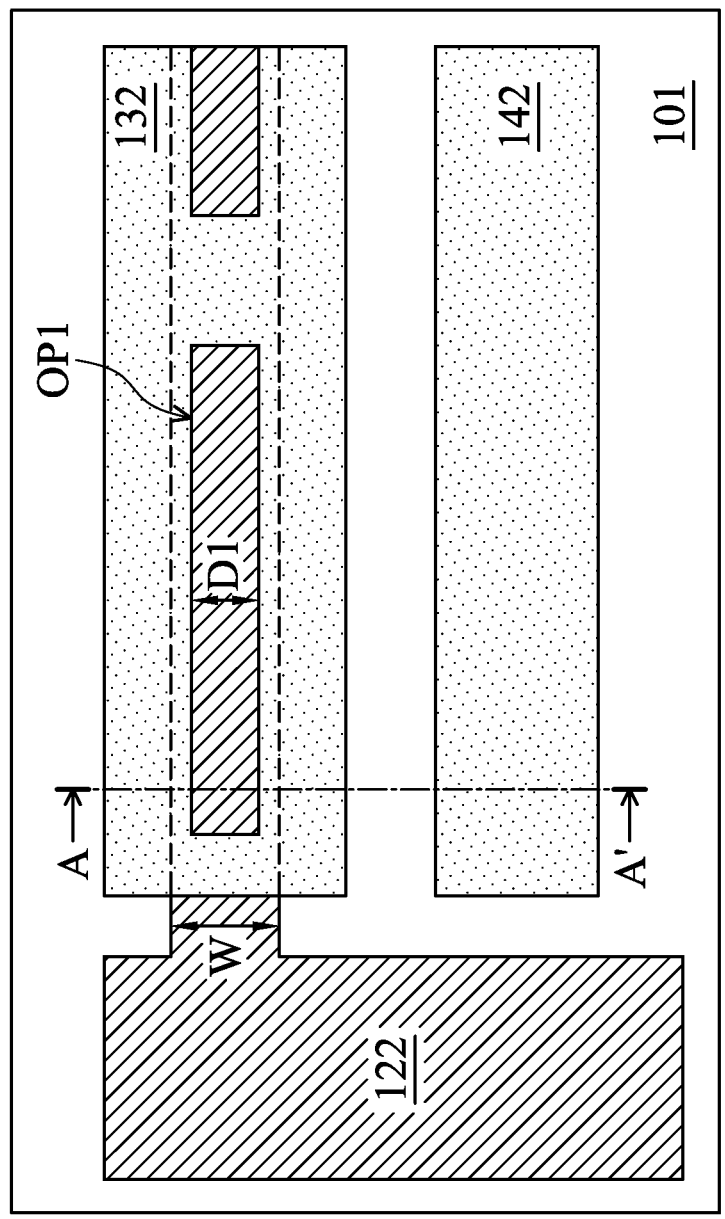
FIG. 1 is a top view illustrating a portion of an exemplary semiconductor structure according to some embodiments of the present disclosure.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "over", "below," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented and the spatially relative descriptors used herein may likewise be interpreted accordingly.

The terms "about", "approximately", and "substantially" used herein generally refer to the value of an error or a range within 20 percent, preferably within 10 percent, and more preferably within 5 percent, within 3 percent, within 2 percent, within 1 percent, or within 0.5 percent. If there is no specific description, the values mentioned are to be regarded as an approximation that is an error or range expressed as "about", "approximate", or "substantially".

The present disclosure provides embodiments of a semiconductor structure which includes a gate field plate to reduce the risk of high electric fields on gate structure, and includes a source field plate to optimize the electric field distribution and effectively reduce the gate-to-drain capacitance ($C_{gd}$). Furthermore, the embodiments of the present disclosure reduce the gate-to-source capacitance ($C_{gs}$) by adjusting the coverage of the source field plate to the gate field plate, and thereby reduce the switch losses. Therefore, the semiconductor structure provided by the embodiments of the present disclosure not only has a good balance between the breakdown voltage and the gate-to-drain capacitance ($C_{gd}$), but also effectively reduces the switching loss, thereby improving the performance of the semiconductor structure.

FIG. 1 is a top view illustrating a portion of an exemplary semiconductor structure 100 according to some embodiments of the present disclosure. As shown in FIG. 1, the semiconductor structure 100 includes a gate metal layer 122, a source metal layer 132, and a drain metal layer 142 disposed on the substrate 101. According to some embodiments of the present disclosure, the source metal layer 132 has an opening OP1 directly above the gate metal layer 122. In some embodiments, the shape of the opening OP1 may be a rectangle. It should be noted that in order to succinctly describe the embodiments of the present disclosure and highlight the technical features thereof, not all the elements of the semiconductor structure 100 are illustrated in FIG. 1.

Figure 2:
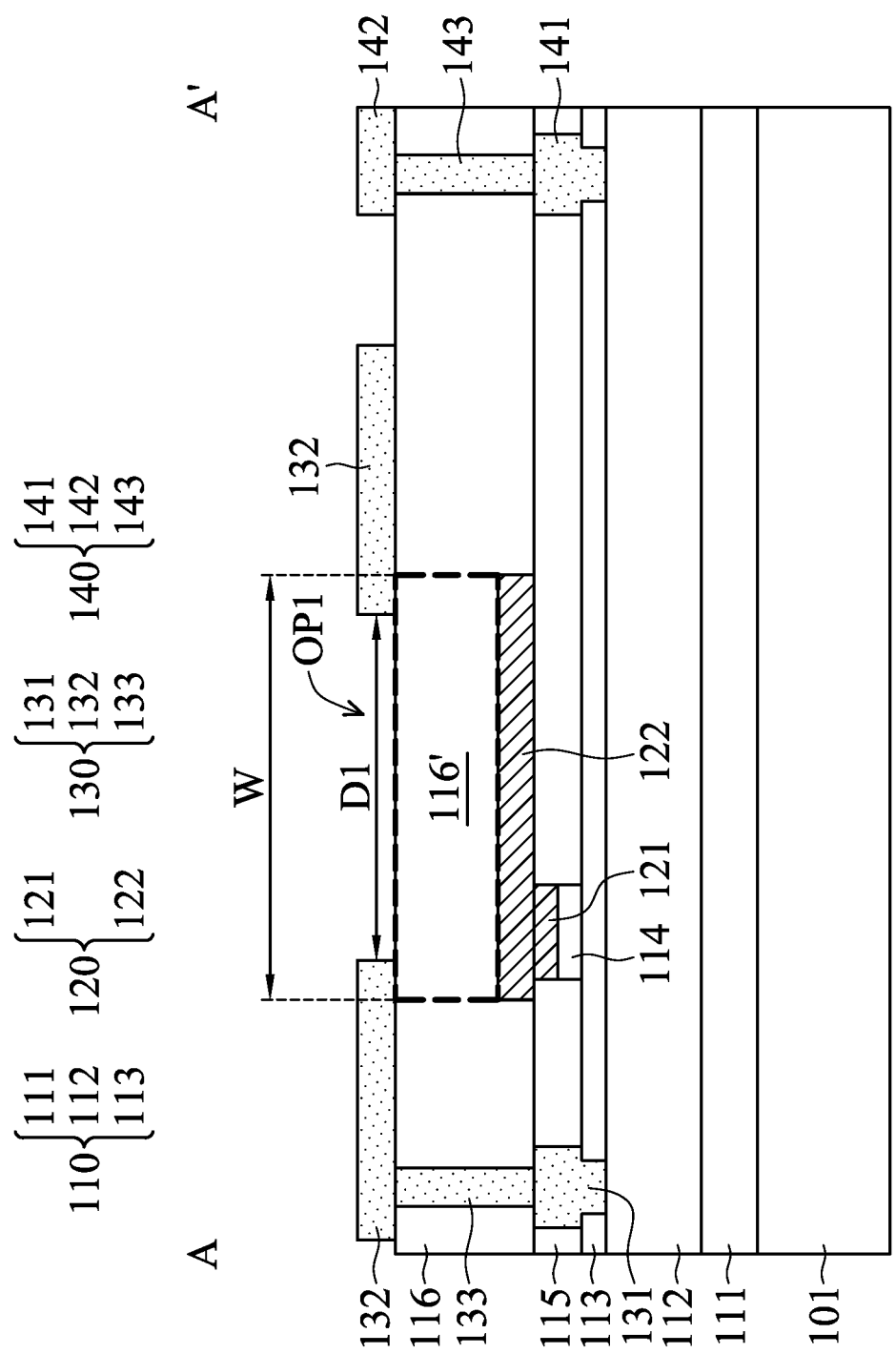
FIG. 2 is a cross-sectional view illustrating a semiconductor structure along the line segment A-A' shown in FIG. 1 according to some embodiments of the present disclosure.

Referring to FIG. 2 along with FIG. 1, FIG. 2 is a cross-sectional view illustrating a semiconductor structure 100 along the line segment A-A' shown in FIG. 1 according to some embodiments of the present disclosure. The semiconductor structure 100 includes a compound semiconductor layer 110 disposed on the substrate 101, a dielectric layer 115 disposed on the compound semiconductor layer 110, and a dielectric layer 116 disposed on the dielectric layer 115. The semiconductor structure 100 further includes a gate structure 120 disposed on the compound semiconductor layer 110, and a source structure 130 and a drain structure 140 disposed on opposite sides of the gate structure 120.

In some embodiments, the substrate 101 may be a doped (such as doped with a p-type or an n-type dopant) or an undoped semiconductor substrate, such as a silicon substrate, a silicon germanium substrate, a gallium arsenide substrate, or the like. In some embodiments, the substrate 101 may be a substrate including a semiconductor on an insulator, such as a silicon on insulator (SOI) substrate. In other embodiments, the substrate 101 may be a ceramic substrate, such as an aluminium nitride (AlN) substrate, a silicon carbide (SiC) substrate, an aluminium oxide ($Al_2O_3$) (or so-called sapphire substrate), or the like.

As shown in FIG. 2, the compound semiconductor layer 110 includes a buffer layer 111, a channel layer 112 disposed on the buffer layer 111, and a barrier layer 113 disposed on the channel layer 112. The buffer layer 111 may be helpful to mitigate a strain of the channel layer 112 which is subsequently formed over the buffer layer 111, and to prevent defects formed in the overlying channel layer 112. The strain is caused by a mismatch between the channel layer 112 and the substrate 101. In some embodiments, the material of the buffer layer 111 may be AlN, GaN, $Al_xGa_{1-x}N$ (wherein 0<x<1), a combination thereof, or the like. The buffer layer 111 may be formed by an epitaxial growth process, such as metal organic chemical vapor deposition (MOCVD), hydride vapor phase epitaxy (HVPE), molecular beam epitaxy (MBE), a combination thereof, or the like. It should be noted that although in the embodiment as shown in FIG. 2 the buffer layer 111 is a single layer structure, the buffer layer 111 may also be a multilayered structure in other embodiments (not shown).

According to some embodiments of the present disclosure, two-dimensional electron gas (2DEG) (not shown) is formed at a heterogeneous interface between the channel layer 112 and the barrier layer 113. The semiconductor structure 100 as shown in FIG. 2 is a high electron mobility transistor (HEMT) which utilizes 2DEG as conductive carriers. In some embodiments, the channel layer 112 may be a GaN layer, and the barrier layer 113 formed on the channel layer 112 may be an AlGaN layer, wherein the GaN layer and the AlGaN layer may be doped, such as with an n-type or a p-type dopant, or may have no dopant therein. The channel layer 112 and the barrier layer 113 may be formed by an epitaxial growth processes, such as MOCVD, HVPE, MBE, a combination thereof, or the like.

Still referring to FIG. 2, subsequently, the dielectric layers 115 and 116, the gate structure 120, and the source structure 130 and the drain structure 140 disposed on opposite sides of the gate structure 120 are formed on the compound semiconductor layer 110 by deposition processes and patterning processes. Specifically, in some embodiments, the gate structure 120 includes a gate electrode 121 and a gate metal layer 122 electrically connected to the gate electrode 121. In some embodiments, the gate electrode 121 is disposed on the barrier layer 113 and buried in the dielectric layer 115, and the gate metal layer 122 is disposed on the dielectric layer 115 and covered by the dielectric layer 116. In other embodiments, an optional doped compound semiconductor layer 114 may be disposed between the gate electrode 121 and the barrier layer 113. Further details are described below.

As shown in FIG. 2, the source structure 130 includes a source electrode 131, a source contact 133, and a source metal layer 132. In some embodiments, the source electrode 131 is buried in the dielectric layer 115, and the source metal layer 132 is disposed on the dielectric layer 116, wherein the source electrode 131 is electrically connected to the source metal layer 132 by the source contact 133 which is buried in the dielectric layer 116. The electric potential of the source metal layer 132 electrically connected to the source electrode 131 is different from the electric potential of the gate metal layer 122 electrically connected to the gate electrode 121.

As shown in FIG. 2, the drain structure 140 includes a drain electrode 141, a drain contact 143, and a drain metal layer 142. In some embodiments, the drain electrode 141 is buried in the dielectric layer 115, and the drain metal layer 142 is disposed on the dielectric layer 116, wherein the drain electrode 141 is electrically connected to the drain metal layer 142 by the drain contact 143 which is buried in the dielectric layer 116. In some embodiments, the source electrode 131 and the drain electrode 141 disposed on opposite sides of the gate electrode 121 both penetrate through the barrier layer 113 and contact the channel layer 112.

According to some embodiments of the present disclosure, the gate metal layer 122 extending in the direction from the gate electrode 121 to the drain electrode 141 to serve as a gate field plate can effectively reduce the risk of high electric fields on gate structure. On the other hand, the source metal layer 132 extending in the direction from the gate electrode 121 to the drain electrode 141 to serve as a source field plate can optimize the electric field distribution and effectively reduce the gate-to-drain capacitance ($C_{gd}$).

In some embodiments, the material of the gate electrode 121 may be conductive materials, such as metal, metal nitride, or semiconductor materials. In some embodiments, the metal materials may be Au, Ni, Pt, Pd, Ir, Ti, Cr, W, Al, Cu, the like, a combination thereof, or multilayers thereof. The semiconductor materials may be polycrystalline silicon or polycrystalline germanium. The conductive material may be formed on the barrier layer 113 by chemical vapor deposition (CVD), sputtering, resistive thermal evaporation process, electron beam evaporation process, or other suitable deposition processes, and a patterning process is performed on the conductive material to form the gate electrode 121.

According to some embodiments of the present disclosure, before the formation of the gate electrode 121, the doped compound semiconductor layer 114 may be formed on the barrier layer 113, and the gate electrode 121 is formed on the doped compound semiconductor layer 114 subsequently. The generation of 2DEG under the gate electrode 121 can be inhibited by the doped compound semiconductor layer 114 disposed between the gate electrode 121 and the barrier layer 113 so as to attain a normally-off status of the semiconductor structure 100. In some embodiments, the material of the doped compound semiconductor layer 114 may be GaN which is doped with a p-type dopant or an n-type dopant. The steps for forming the doped compound semiconductor layer 114 may include an epitaxial growth process and an etch back process to form the doped compound semiconductor layer 114 corresponding to the predetermined position where the gate electrode 121 is to be formed.

In some embodiments, the materials of the source electrode 131 and the drain electrode 141 which are formed on opposite sides of the gate electrode 121 may be selected from the materials for forming the gate electrode 121. Furthermore, the gate electrode 121 and the source/drain electrodes 131/141 formed on opposite sides of the gate electrode 121 may be formed simultaneously in the same process. The details are not described again herein to avoid repetition. In other embodiments, the gate electrode 121 and the source/drain electrodes 131/141 formed on opposite sides of the gate electrode 121 may be formed in different processes.

In some embodiments, the gate metal layer 122, the source contact 133, the source metal layer 132, the drain contact 143, and the drain metal layer 142 may be formed by deposition processes and patterning processes. The material of the gate metal layer 122, the source contact 133, the source metal layer 132, the drain contact 143, and the drain metal layer 142 may include conductive materials, such as aluminium (Al), copper (Cu), tungsten (W), titanium (Ti), tantalum (Ta), titanium nitride (TiN), tantalum nitride (TaN), nickel silicide (NiSi), cobalt silicide (CoSi), tantalum carbide (TaC), tantalum silicide nitride (TaSiN), tantalum carbide nitride (TaCN), titanium aluminide (TiAl), titanium aluminide nitride (TiAlN), metal oxides, metal alloys, other suitable conductive materials, or a combination thereof.

In some embodiments, the dielectric layers 115 and 116 may respectively include single layer or multi-layers of dielectric materials, such as silicon oxide, silicon nitride, silicon oxynitride, tetraethoxysilane (TEOS), phosphosilicate glass (PSG), borophosphosilicate glass (BPSG), low-k dielectric materials, and/or other suitable dielectric materials. The low-k dielectric materials may include fluorinated silica glass (FSG), hydrogen silsesquioxane (HSQ), carbon-doped silicon oxide, amorphous fluorinated carbon, parylene, bis-benzocyclobutenes (BCB), or polyimide, but not limited thereto. For example, a deposition process, such as spin coating, chemical vapor deposition (CVD), physical vapor deposition (PVD), atomic layer deposition (ALD), high density plasma CVD (HDPCVD), other suitable methods, or a combination thereof, may be used to form the dielectric layers 115 and 116.

Still referring to FIG. 2, according to some embodiments of the present disclosure, the dielectric layer 116 is disposed between the gate metal layer 122 and the source metal layer 132. The dielectric layer 116 which covers the gate metal layer 122 includes a dielectric layer portion 116' that is disposed directly above (i.e. the normal direction of the substrate 101) the gate metal layer 122. Specifically, in the cross-sectional view of the semiconductor structure 100 illustrated in FIG. 2, the dielectric layer portion 116' that is disposed directly above the gate metal layer 122 has opposite edges that are aligned with the gate metal layer 122. Referring back to FIG. 1, from a top view, the source metal layer 132 has an opening OP1 corresponding to the gate metal layer 122. Referring to FIG. 1 along with FIG. 2, in the cross-sectional view, the source metal layer 132 has an opening OP1 corresponding to the gate metal layer 122 and exposing the dielectric layer portion 116' that is disposed directly above the gate metal layer 122. In such an embodiment, the width W of the gate metal layer 122 (i.e. the width of the dielectric layer portion 116') is greater than the width D1 of the opening OP1. The opening OP1 does not completely expose the dielectric layer portion 116', and the projections of the source metal layer 132 and the gate metal layer 122 on the substrate 101 partially overlap.

According to some embodiments of the present disclosure, the coverage of the source field plate (e.g. source metal layer 132) to the gate field plate (e.g. gate metal layer 122) can be reduced by increasing the size (e.g. the width D1) of the opening OP1 to reduce the gate-to-source capacitance ($C_{gs}$), thereby increasing switching speed to reduce switch loss. It should be noted that the coverage of the source metal layer 132 to the gate metal layer 122 is merely exemplary, and it may be adjusted depending on the product design and the required switching speed.

Figure 3:
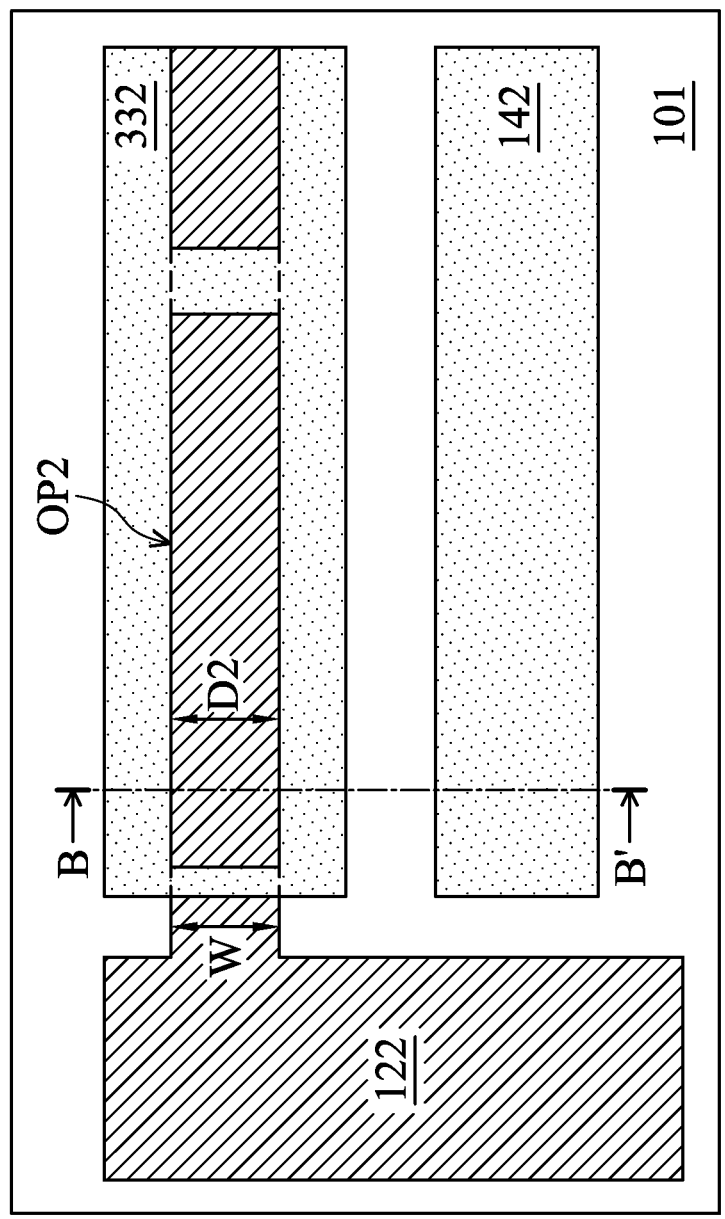
FIG. 3 is a top view illustrating a portion of an exemplary semiconductor structure according to other embodiments of the present disclosure.
Figure 4:
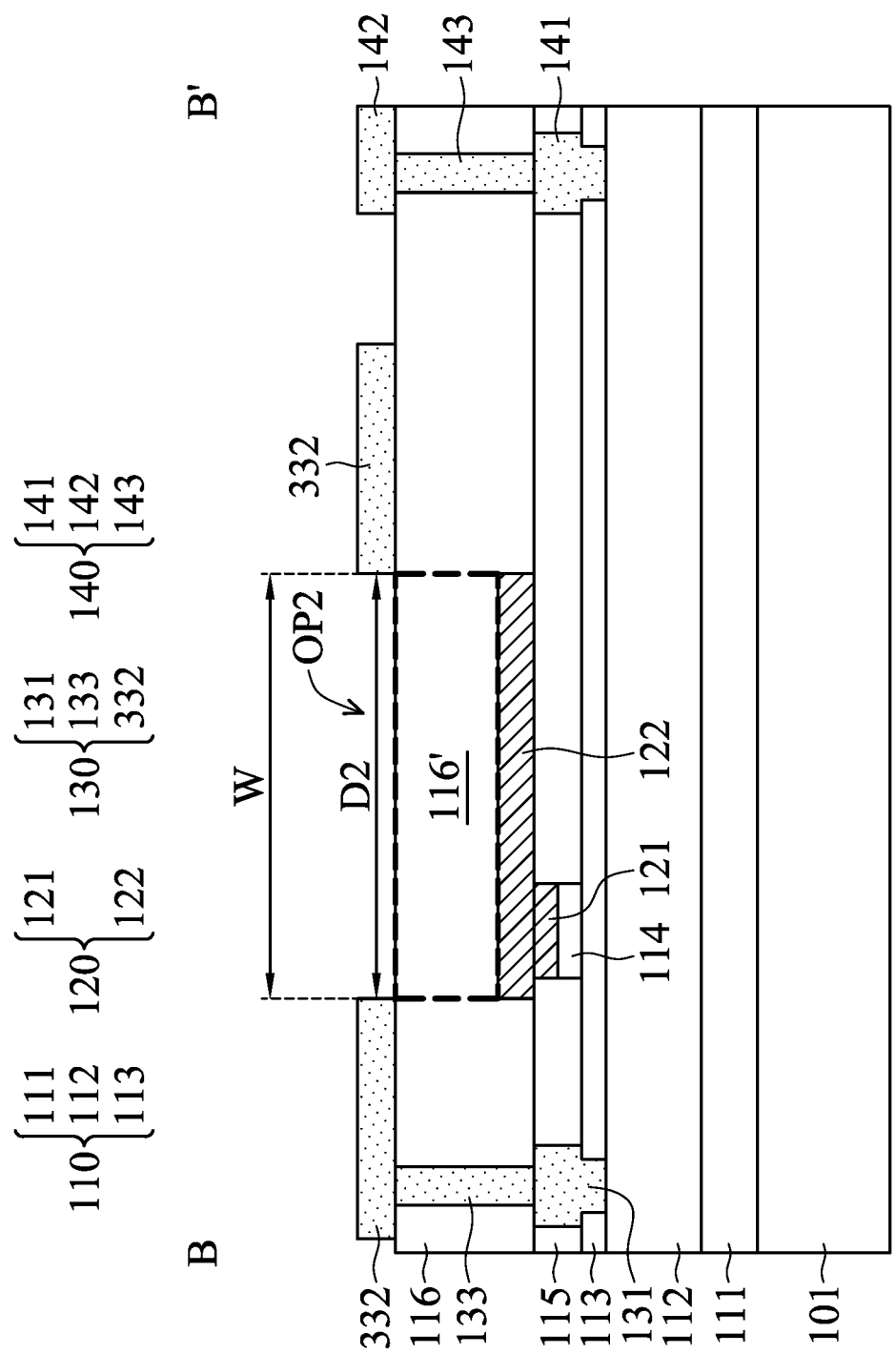
FIG. 4 is a cross-sectional view illustrating a semiconductor structure along the line segment B-B' shown in FIG. 3 according to some embodiments of the present disclosure.

Referring to FIG. 3 along with FIG. 4, FIG. 3 is a top view illustrating a portion of an exemplary semiconductor structure 300 according to other embodiments of the present disclosure, and FIG. 4 is a cross-sectional view illustrating the semiconductor structure 300 along the line segment B-B' shown in FIG. 3. It should be noted that in order to succinctly describe the embodiments of the present disclosure and highlight the technical features thereof, not all the elements of the semiconductor structure 300 in FIG. 4 are illustrated in FIG. 3.

The semiconductor structure 300 illustrated in FIGS. 3 and 4 are substantially similar to the semiconductor structure 100 respectively illustrated in FIGS. 1 and 2, and the difference is that the source metal layer 332 of the semiconductor structure 300 has an opening OP2 with a greater size.

In the cross-sectional view illustrated in FIG. 4, the width D2 of the opening OP2 of the source metal layer 332 is substantially the same as the width W of the gate metal layer 122 (i.e. the width of the dielectric layer portion 116'). In some embodiments, the opening OP2 completely exposes the dielectric layer portion 116', and the projection of the source metal layer 332 on the substrate 101 aligns to the projection of the gate metal layer 122 on the substrate 101. In such an embodiment, the opposite edges of the opening OP2 substantially align to the opposite edges of the gate metal layer 122. In other embodiments, the width D2 of the opening OP2 of the source metal layer 332 is greater than the width W of the gate metal layer 122 (i.e. the width of the dielectric layer portion 116') (not shown), and the opening OP2 not only completely exposes the dielectric layer portion 116' but also the dielectric layer 116 neighboring the dielectric layer portion 116', and the projections of the source metal layer 332 and the gate metal layer 122 on the substrate 101 do not overlap at all.

In the embodiments shown in FIG. 4, the coverage of the source field plate (e.g. source metal layer 132) to the gate field plate (e.g. gate metal layer 122) is further reduced by the opening OP2 with a greater size to further reduce the gate-to-source capacitance ($C_{gs}$), thereby increasing switching speed to reduce switch loss. Thus, the switching speed of the semiconductor structure 300 illustrated in FIGS. 3 and 4 is greater than the switching speed of the semiconductor structure 100 illustrated in FIGS. 1 and 2.

Figure 5:
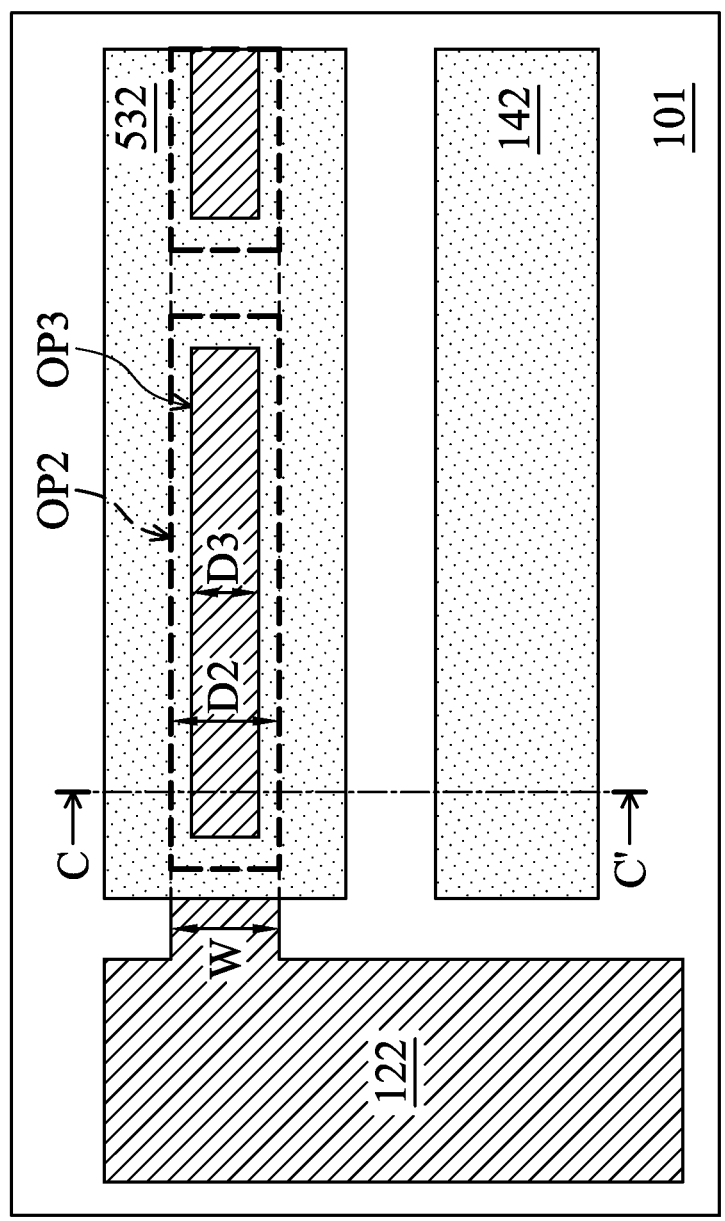
FIG. 5 is a top view illustrating a portion of an exemplary semiconductor structure according to other embodiments of the present disclosure.
Figure 6:
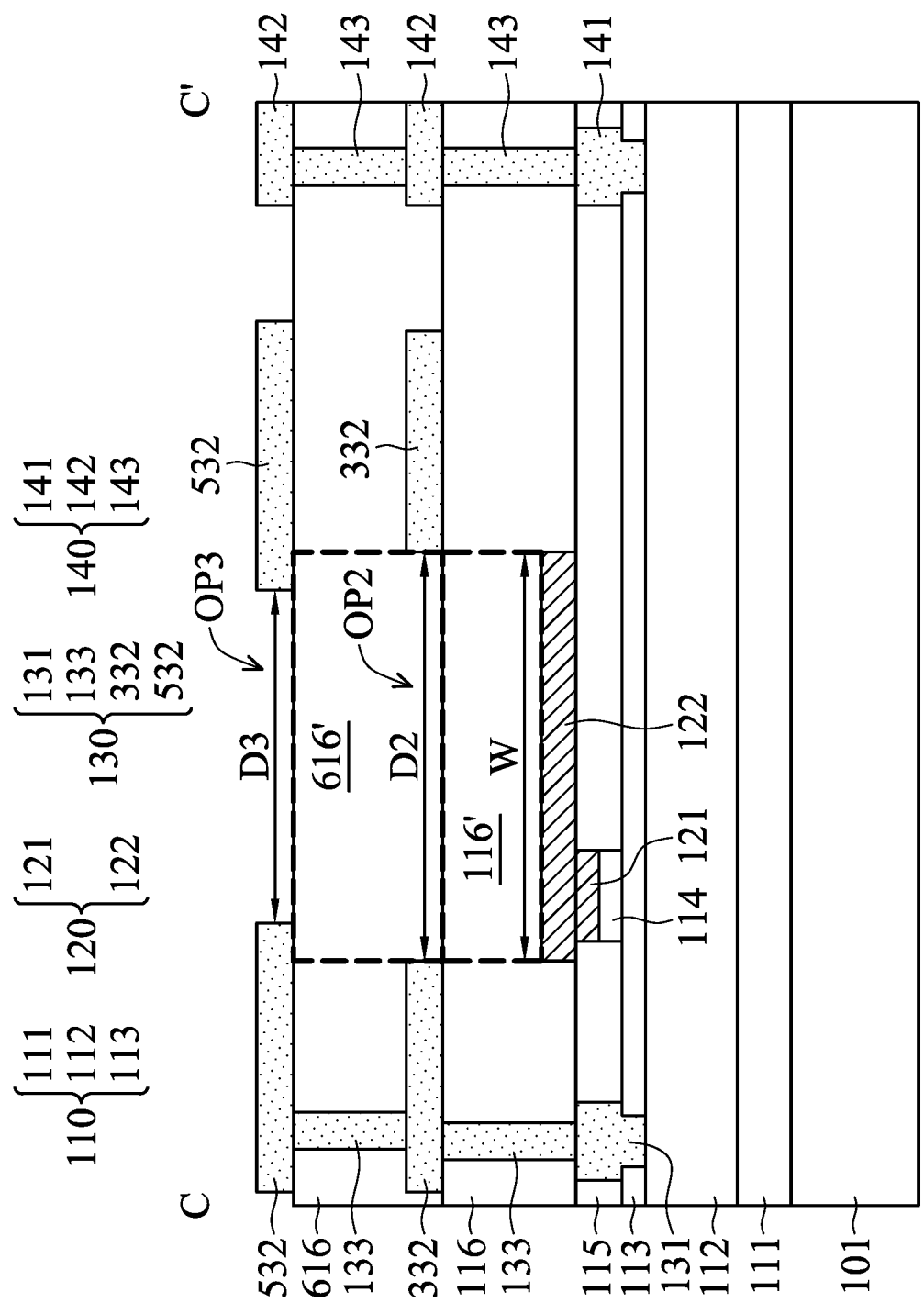
FIG. 6 is a cross-sectional view illustrating a semiconductor structure along the line segment C-C' shown in FIG. 5 according to some embodiments of the present disclosure.

Referring to FIG. 5 along with FIG. 6, FIG. 5 is a top view illustrating a portion of an exemplary semiconductor structure 500 according to other embodiments of the present disclosure, and FIG. 6 is a cross-sectional view illustrating the semiconductor structure 500 along the line segment C-C' shown in FIG. 5. It should be noted that in order to succinctly describe the embodiments of the present disclosure and highlight the technical features thereof, not all the elements of the semiconductor structure 500 in FIG. 6 are illustrated in FIG. 5.

The semiconductor structure 500 illustrated in FIGS. 5 and 6 are substantially similar to the semiconductor structure 300 respectively illustrated in FIGS. 3 and 4, and the difference is that the semiconductor structure 500 illustrated in FIGS. 5 and 6 further includes an additional source field plate. Specifically, the semiconductor structure 500 further includes a dielectric layer 616 disposed on the source metal layer 332 and the dielectric layer 116, and a source metal layer 532 disposed on the dielectric layer 616. In some embodiments, the source metal layer 532 can serve as an additional source metal layer. The source metal layer 532 is electrically connected to the source electrode 131 and the source metal layer 332 by the source contact 131. The electric potential of the source metal layers 332 and 532 electrically connected to the source electrode 131 is different from the electric potential of the gate metal layer 122 electrically connected to the gate electrode 121.

As shown in FIG. 6A, the dielectric layer 616 is disposed between the source metal layer 332, the dielectric layer 116, and the source metal layer 532, wherein the dielectric layer 616 includes a dielectric layer portion 616' directly above the gate metal layer 122. Specifically, in the cross-sectional view of the semiconductor structure 500 illustrated in FIG. 6, the dielectric layer portion 616' above the gate metal layer 122 and the dielectric layer portion 116' has opposite edges that are aligned with the gate metal layer 122. In some embodiments, as shown in FIG. 6, the source metal layer 532 has an opening OP3 directly above the dielectric layer portion 616' and exposing the dielectric layer portion 616'. In such an embodiment, the width W of the gate metal layer 122 (i.e. the width of the dielectric layer portions 116' and 616') is greater than the width D3 of the opening OP3. The opening OP3 does not completely expose the dielectric layer portion 616', and the projections of the source metal layer 532 and the gate metal layer 122 on the substrate 101 partially overlap.

In the embodiments of the semiconductor structure with multiple source field plates, in addition to adjusting the coverage of the source field plate (e.g. source metal layer 332) relative to the gate field plate (e.g. gate metal layer 122), the coverage of each additional source metal layers to the underlying gate metal layer 122 can be further adjusted. The degree of coverage of the source metal layers to the gate metal layer 122 is beneficial to reduce the gate-to-source capacitance ($C_{gs}$), thereby increasing the switching speed to reduce switch losses. It should be noted that although merely two layers of source metal layers 332 and 532 with openings are shown in the embodiments of the present disclosure, the number of source metal layers, the size of the openings of the source metal layers, and the coverage of the gate metal layer 122 can be adjusted according to the product design and the required switching speed, and the disclosure is not limited thereto.

Figure 7:
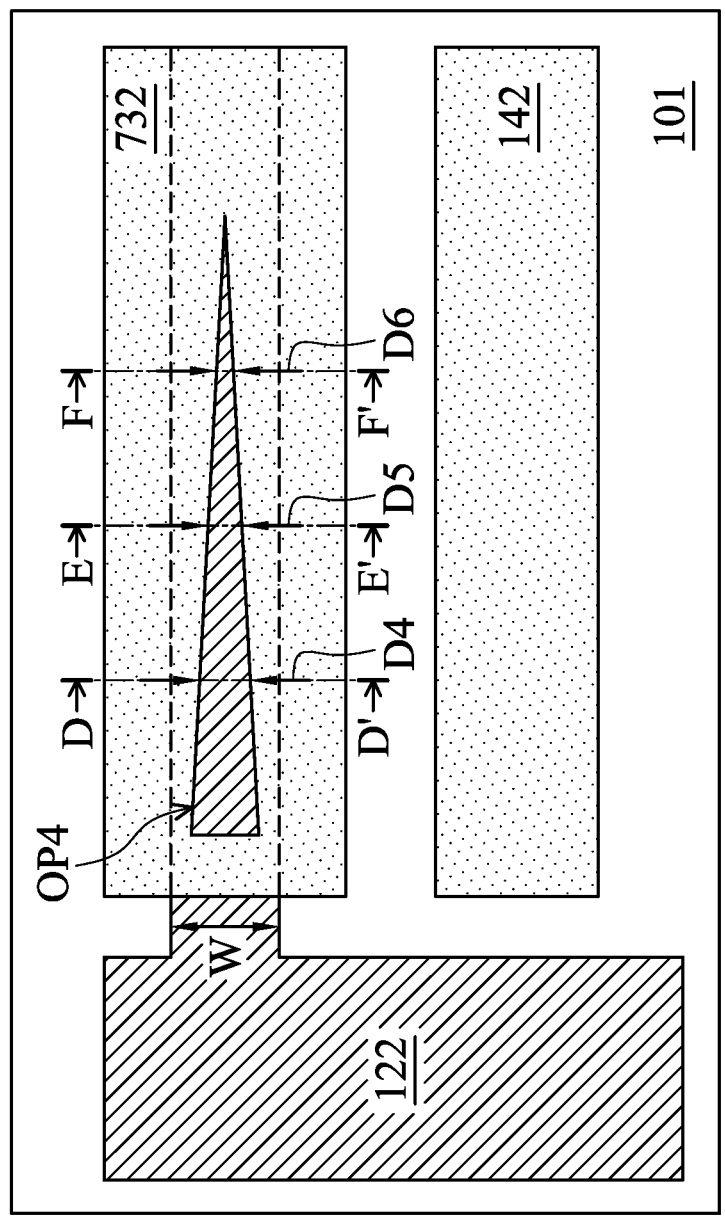
FIG. 7 is a top view illustrating a portion of an exemplary semiconductor structure according to other embodiments of the present disclosure.

FIG. 7 is a top view illustrating a portion of an exemplary semiconductor structure 700 according to other embodiments of the present disclosure. As shown in FIG. 7, the source metal layer 732 included in the semiconductor structure 700 has an opening OP4 directly above the gate metal layer 122. In such an embodiment, the shape of the opening OP4 is a triangle, and the width of the opening OP4 varies linearly along the lengthwise direction of the opening OP4. In FIG. 7, the line segments D-D', E-E', and F-F' in the lengthwise direction of the opening OP4 are respectively illustrated, wherein the direction of the line segments D-D', E-E', and F-F' is parallel to the flow direction of electrons. In such an embodiment, the line segments D-D', E-E', and F-F' may respectively correspond to the linearly varying widths D4, D5, and D6 of the opening OP4. In FIG. 7, the widths D4, D5, and D6 are all less than the width W of the gate metal layer 122, the width D4 is greater than the width D5, and the width D5 is greater than the width D6. In the embodiment shown in FIG. 7, the configuration of the opening of the source metal layer can be adjusted according to the product design and the required switching speed, so that the coverage of the source field plate to the gate field plate in different cross-sections of the electron flow direction in the semiconductor structure are different.

Figure 8:
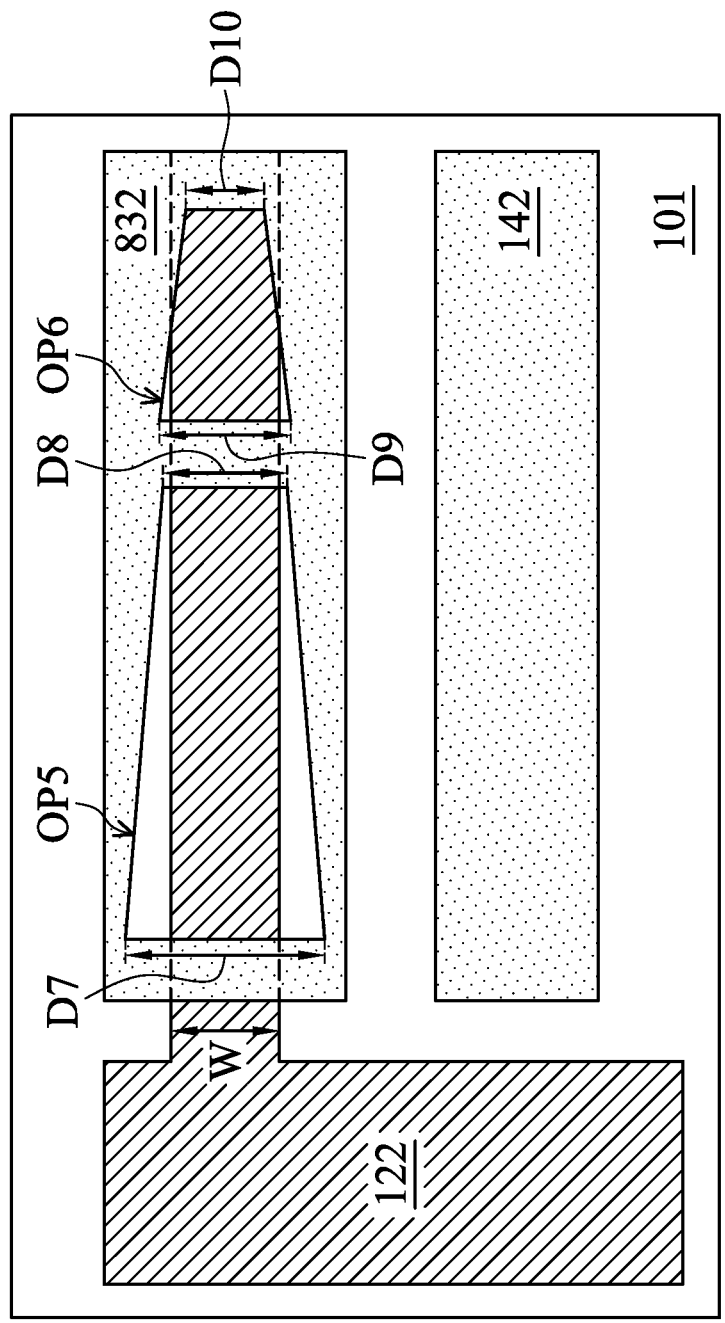
FIG. 8 is a top view illustrating a portion of an exemplary semiconductor structure according to other embodiments of the present disclosure.
Figure 9:
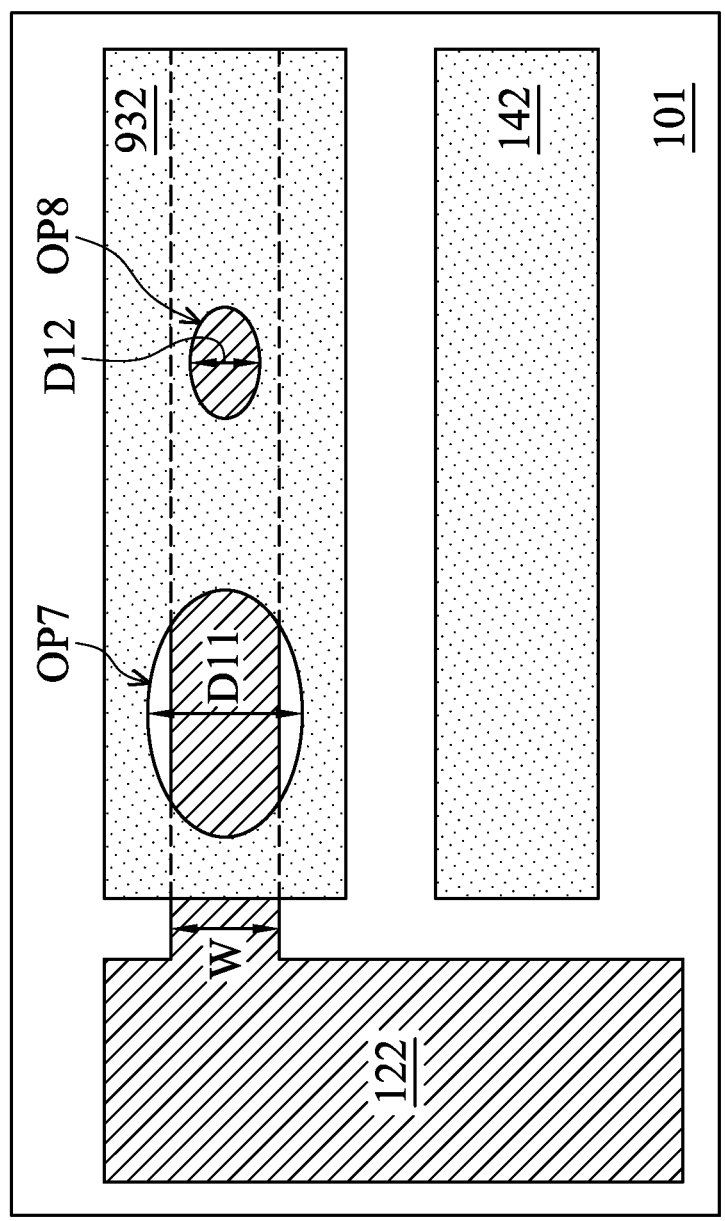
FIG. 9 is a top view illustrating a portion of an exemplary semiconductor structure according to other embodiments of the present disclosure.

Furthermore, depending on product characteristics, the source field plate (e.g. source metal layer) may have two or more openings with different sizes and/or shapes directly above the gate field plate (e.g. gate metal layer) (as shown in FIGS. 8 and 9), so that the coverage of the source field plate to the gate field plate in different cross-sections of the electron flow direction in the semiconductor structure are different. FIG. 8 is a top view illustrating a portion of an exemplary semiconductor structure 800 according to some other embodiments of the present disclosure. As shown in FIG. 8, the source metal layer 832 included in the semiconductor structure 800 has openings OP5 and OP6 directly above the gate metal layer 122. In such an embodiment, the openings OP5 and OP6 are trapezoids of different sizes. In some embodiments, the opening OP5 has a maximum width D7 and a minimum width D8, wherein the maximum width D7 and the minimum width D8 are both greater than the width W of the gate metal layer 122. In some embodiments, the opening OP6 has a maximum width D9 and a minimum width D10, wherein the maximum width D9 is greater than the width W of the gate metal layer 122 and the minimum width D10 is less than the width W of the gate metal layer 122.

FIG. 9 is a top view illustrating a portion of an exemplary semiconductor structure 900 according to some other embodiments of the present disclosure. As shown in FIG. 9, the source metal layer 932 included in the semiconductor structure 900 has openings OP7 and OP8 directly above the gate metal layer 122. In such an embodiment, the openings OP7 and OP9 are ellipses with different sizes. In some embodiments, the length D11 of the minor axis of the opening OP7 is greater than the width W of the gate metal layer 122. In some embodiments, the length D12 of the minor axis of the opening OP8 is less than the width W of the gate metal layer 122.

It should be noted that, in the semiconductor structure provided by the embodiment of the present disclosure, the number, size, and shape of the openings in the source metal layer directly above the gate metal layer are not limited to the above embodiments. For example, various polygons (e.g. pentagons, hexagons, or octagons, and so on), circles, or openings having irregular curved contours may also be applied to the semiconductor structure provided in the embodiments of the present disclosure. Depending on the product design and the required switching speed, the number, size, and shape of the openings described in the various embodiments described above can be integrated into a single semiconductor structure to adjust the degree of coverage of the source metal layer which serves as a source field plate to the gate metal layer which serves as a gate field plate.

In summary, the present disclosure provides embodiments of a semiconductor structure which reduces the risk of the gate structure being subjected to a high electric field by the gate field plate, and optimizes the electric field distribution and reduces the gate-to-drain capacitance ($C_{gd}$) by the source field plate. Moreover, by forming an opening in the source metal layer to adjust the coverage of the gate field plate, the gate-to-source capacitance (Cgs) is reduced, thereby achieving the purpose of reducing switch loss. Therefore, the semiconductor structure provided by the embodiments of the present disclosure not only has a good balance between the breakdown voltage and the gate-to-drain capacitance ($C_{gd}$), but also effectively reduces the switching loss, thereby improving the performance of the semiconductor structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a gate structure disposed on the substrate, comprising:
     a gate electrode disposed on the substrate; and
     a gate metal layer electrically connected to the gate electrode and serving as a gate field plate; and
   a source structure and a drain structure disposed on the substrate and on opposite sides of the gate structure, wherein the source structure comprises:
     a source electrode disposed on the substrate; and
     a first source metal layer electrically connected to the source electrode and extending in a direction from the gate electrode to the drain structure; and
   a first dielectric layer disposed on the gate metal layer;
   wherein an electric potential of the first source metal layer is different from an electric potential of the gate metal layer, and the first source metal layer exposes at least a portion of the first dielectric layer directly above the gate metal layer.

2. The semiconductor structure as claimed in claim 1, wherein the first source metal layer completely exposes the first dielectric layer directly above the gate metal layer.

3. The semiconductor structure as claimed in claim 1, further comprising a second dielectric layer disposed on the first source metal layer and the first dielectric layer.

4. The semiconductor structure as claimed in claim 3, wherein the source structure further comprises:
   a second source metal layer electrically connected to the source electrode and disposed on the second dielectric layer, wherein the second source metal layer exposes at least a portion of the second dielectric layer directly above the gate metal layer.

5. The semiconductor structure as claimed in claim 4, wherein the source structure further comprises:
   a plurality of source contacts, wherein the source electrode, the first source metal layer, and the second source metal layer are electrically connected to each other by the plurality of source contacts.

6. The semiconductor structure as claimed in claim 1, further comprising a compound semiconductor layer disposed on the substrate, wherein the compound semiconductor layer comprises:
   a buffer layer disposed on the substrate;
   a channel layer disposed on the buffer layer, wherein the source structure and the drain structure respectively contact the channel layer through a source electrode and a drain electrode; and
   a barrier layer disposed on the channel layer.

7. The semiconductor structure as claimed in claim 6, further comprising a doped compound semiconductor layer disposed between the gate electrode and the barrier layer.

8. A semiconductor structure, comprising:
   a substrate;
   a gate structure disposed on the substrate, comprising:
     a gate electrode disposed on the substrate; and
     a gate metal layer electrically connected to the gate electrode and serving as a gate field plate; and
   a source structure disposed on the substrate, comprising:
     a source electrode disposed on the substrate; and
     a first source metal layer electrically connected to the source electrode and serving as a source field plate, wherein an electric potential of the first source metal layer is different from an electric potential of the gate metal layer, wherein from a top view, the first source metal layer has an opening directly above the gate metal layer; and
   a drain structure disposed on the substrate.

9. The semiconductor structure as claimed in claim 8, wherein a width of the opening varies linearly along a lengthwise direction of the opening.

10. The semiconductor structure as claimed in claim 8, wherein the opening has a first width and a second width, wherein the first width is less than a width of the gate metal layer, and the first width is different from the second width.

11. The semiconductor structure as claimed in claim 10, wherein the second width is less than the width of the gate metal layer.

12. The semiconductor structure as claimed in claim 10, wherein the second width is greater than the width of the gate metal layer.

13. The semiconductor structure as claimed in claim 8, wherein the opening has a minimum width and a maximum width, wherein the minimum width and the maximum width are both greater than a width of the gate metal layer.

14. The semiconductor structure as claimed in claim 8, wherein a shape of the opening is a rectangle.

15. The semiconductor structure as claimed in claim 8, wherein the opening has an arc-shaped contour.

16. The semiconductor structure as claimed in claim 8, wherein the source structure further comprises:
a second source metal layer electrically connected to the source electrode and disposed on the first source metal layer, wherein the second source metal layer has an opening directly above the gate metal layer.

17. The semiconductor structure as claimed in claim 16, wherein the source structure further comprises:
a plurality of source contacts, wherein the source electrode, the first source metal layer, and the second source metal layer are electrically connected to each other by the plurality of source contacts.

18. The semiconductor structure as claimed in claim 16, further comprising:
a plurality of dielectric layers respectively disposed between the gate metal layer, the first source metal layer, and the second source metal layer.

19. The semiconductor structure as claimed in claim 8, further comprising a compound semiconductor layer disposed on the substrate, wherein the compound semiconductor layer comprises:
a buffer layer disposed on the substrate;
a channel layer disposed on the buffer layer, wherein the source structure and the drain structure respectively contact the channel layer through a source electrode and a drain electrode; and
a barrier layer disposed on the channel layer.

20. The semiconductor structure as claimed in claim 19, further comprising a doped compound semiconductor layer disposed between the gate electrode and the barrier layer.

* * * * *